(12) United States Patent
Lyoo et al.

(10) Patent No.: US 6,604,010 B2
(45) Date of Patent: *Aug. 5, 2003

(54) SYSTEM FOR SELECTIVELY MANAGING WORKPIECES AND A METHOD FOR CONTROLLING THE SAME

(75) Inventors: Geun-Hee Lyoo, Cheonan (KR); Sung-Joon Byun, Cheonan (KR)

(73) Assignee: Samsung Electronics Co., Ltd., Suwon (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/395,954

(22) Filed: Sep. 14, 1999

(65) Prior Publication Data

US 2003/0083766 A1 May 1, 2003

(30) Foreign Application Priority Data

Apr. 11, 1998 (KR) .......................................... 98-47083

(51) Int. Cl.⁷ .............................................. G06F 19/00
(52) U.S. Cl. ....................................... 700/100; 700/115
(58) Field of Search ........................... 700/95, 99, 100, 700/101, 112, 106, 115, 116, 121, 213, 214

(56) References Cited

U.S. PATENT DOCUMENTS

| | | | | |
|---|---|---|---|---|
| 4,027,246 A | * | 5/1977 | Caccoma et al. | 700/121 |
| 4,974,166 A | * | 11/1990 | Maney et al. | 700/113 |
| 5,014,208 A | * | 5/1991 | Wolfson | 700/99 |
| 5,189,624 A | * | 2/1993 | Barlow et al. | 700/169 |
| 5,528,503 A | * | 6/1996 | Moore et al. | 700/95 |
| 5,657,252 A | * | 8/1997 | George | 700/96 |
| 5,668,056 A | * | 9/1997 | Wu et al. | 438/106 |
| 5,751,581 A | * | 5/1998 | Tau et al. | 700/115 |
| 5,975,740 A | * | 11/1999 | Lin et al. | 700/99 |
| 6,108,585 A | * | 8/2000 | Ryan et al. | 700/112 |
| 6,169,935 B1 | * | 1/2001 | Iwasaki et al. | 700/214 |
| 6,356,804 B1 | * | 3/2002 | Conboy et al. | 700/228 |

* cited by examiner

Primary Examiner—Leo Picard
Assistant Examiner—Zoila Cabrera
(74) Attorney, Agent, or Firm—McGuireWoods LLP

(57) ABSTRACT

Disclosed is a system for selectively managing workpieces used in the process of manufacturing semiconductor elements. The present invention comprises equipment for receiving a cassette having a plurality of workpieces and for executing a job on the workpieces; a database having job schedules on the workpieces and information on the cassette; and a controller for referring to workpiece information and job schedule information from the database and controlling the job of the equipment when the cassette is loaded into the equipment. This system provides for loading a cassette with workpieces equipment, and at the same time an equipment server and a host refers to job schedules of the workpieces from a file server, and select workpieces to be processed by the equipment. Since the selected workpieces are processed with different job schedules, the equipment can be automatically and remotely driven without manual mechanical manipulation and operator handling.

6 Claims, 5 Drawing Sheets

FIG.2a

| job instruction | 100 / 110 |
|---|---|
| LOT ID | 120a |
| input port ID | 120b |
| input cassette ID | 120c |
| job schedule ID | 120d |
|  | 120e |
| start slot NO | 120f |
| last slot NO | 120g |
| glass ID_1 | 130a |
| glass ID_2 | 130b |
| glass ID_3 | 130c |
| glass ID_4 | 130d |
| glass ID_5 | 130e |
| glass ID_6 | 130f |
| glass ID_7 | 130g |

SYSTEM FOR SELECTIVELY MANAGING WORKPIECES AND A METHOD FOR CONTROLLING THE SAME

BACKGROUND OF THE INVENTION (a) Field of the Invention

The present invention relates to a workpiece management system and a control method. More specifically, the present invention relates to a system for selectively managing workpieces used in the process of manufacturing semiconductor elements or thin film transistor liquid crystal displays (TFT-LCDs) and a method for controlling the same.

(b) Description of the Related Art

A conventional system and a method for selectively managing workpieces will first be described in the process of manufacturing TFT-LCDs.

A plurality of glass substrates i.e., workpieces in identical cassettes are transferred to equipment systems that respectively perform testing, repairing, cleaning, heating, and sealing processes, and are assembled into TFT-LCDs. The above noted processes that the glass substrates pass through are called a 'job schedule.'

All the glass substrates in identical cassettes pass through the above mentioned equipment systems, although some glass substrates may pass through separate equipment systems. However, when a cassette is carried through the conventional TFT-LCD manufacturing processes, each piece of equipment receives a job schedule to handle all of the glass substrates in an individual cassette. Therefore, when glass substrates to be handled with at least two different job schedules are in the same cassette, these glass substrates cannot be handled with a single command. In the conventional system, it is impossible for an operator or host to select specific glass substrates and to assign different job schedules to each individual glass substrate.

Hence, when an operator attempts to selectively assign job schedules for individual glass substrates in a cassette in the conventional TFT-LCD manufacturing processes (either off-line or on-line), he must separately and manually operate each piece of equipment. However, it may not be appropriate for some types of equipment that requires continuous and detailed job instruction inputs such as particle measuring and/or monitoring devices.

SUMMARY OF THE INVENTION

It is an object of the present invention to provide a system and a control method in remote on-line manufacturing processes for selectively managing workpieces having different job schedules within an individual cassette without operator's intervention.

In one aspect of the present invention, a system for selectively managing workpieces comprises equipment for receiving a cassette that has a plurality of workpieces and for performing a job on the workpieces, a database for maintaining job schedules on the workpieces and information on the cassette, and a controller for reading workpiece information and job schedule information from the database and controlling the equipment for the job when the cassette is loaded into the equipment, the workpiece information being to be performed on the equipment and the job schedule information being on a workpiece selected from among all the workpieces stored in the cassette.

The controller selects specified workpieces from among the workpieces stored in the cassette and controls the equipment so that the specified workpieces are processed with identical job schedules, and selects all the workpieces stored in the cassette and controls the equipment so that the workpieces are processed with at least two job schedules. The controller also selects specified workpieces stored on the cassette and controls the equipment so that the specified workpieces are processed with at least two job schedules.

The controller comprises an equipment server for controlling the equipment, and a host for transmitting workpiece information and job schedule information to the equipment server when a cassette is loaded into the equipment. Here, the workpiece information is executed on the equipment and the job schedule information is for a workpiece selected from all the workpieces stored on the cassette.

The host comprises a carrier manager for controlling an automatic transferring device so that a cassette is transferred between the plurality of equipment and stocker devices, a cassette manager for managing job status of the cassette carried by the automatic transferring device and a workpiece manager for managing job status and job schedules of a plurality of the workpieces stored on the cassette.

In another aspect of the present invention, a control method for selectively managing workpiece is provided, comprising the steps of reporting that a cassette that stores a plurality of workpieces is loaded into an equipment, referring to workpiece information on the database to be executed on the equipment and job schedule information on the selected workpiece from the workpieces stored in the cassette, and generating and transmitting a job start messages containing the above noted information and receiving the job start message, and selecting a workpiece stored on the cassette according to the information of the job start message, and handling the selected workpiece with the job schedule.

In the step of handling the selected workpiece with the job schedule, specified workpieces selected from the workpieces stored in the cassette, and specified workpieces are processes with identical job schedules, and all the workpieces stored on the cassette are selected and the selected workpieces are executed with a plurality of job schedules, and specified workpieces can be selected from among the workpieces stored on the cassette, and the specified workpieces are executed with a plurality of job schedules.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive.

Figure 1:
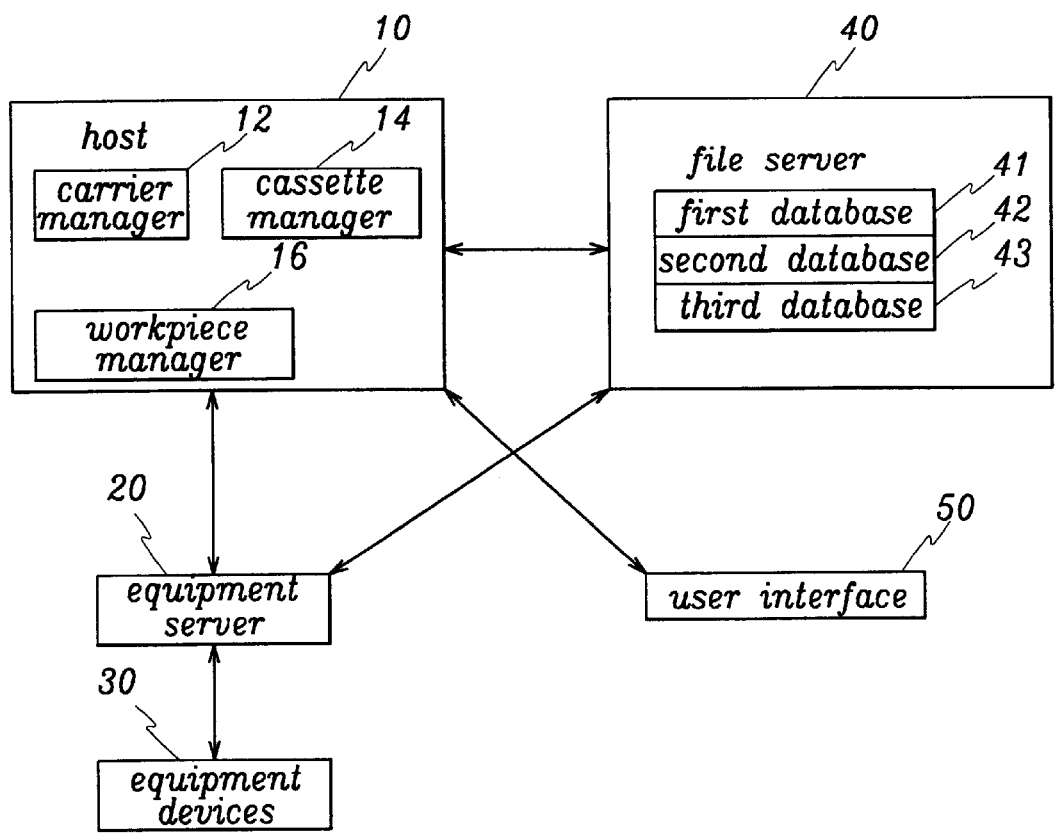
FIG. 1 is a schematic block diagram of a system for selectively managing workpieces according to an embodiment of the present invention.

FIG. 1 shows a schematic block diagram of a system for selectively managing workpieces according to an embodiment of the present invention.

As shown, the system for selectively managing workpieces comprises a host 10, an equipment server 20, equipment devices 30, a file server 40, and a user interface 50. The host 10 comprises a carrier manager 12, a cassette manager 14 and a workpiece manager 16. The carrier manager 12 controls an automatic transportation device (not illustrated) so that cassettes may be transferred between a plurality of equipment and stocker devices. The cassette manager 14 manages the job status of the cassette transferred by the automatic transportation device and the workpiece manager 16 manages the respective job status and job schedules of a plurality of the workpieces (i.e., glass substrates) stored in the cassette.

The equipment server 20, located between the host 10 and equipment devices 30, receives messages for the equipment from the host 10 and manages the equipment devices 30 and handles various events (cassette loading and unloading, etc.) performed by the equipment devices 30 and reports the results to the host 10. The equipment devices 30 select and handle workpieces under the control of the equipment server 20.

The file server 40 has database 41, 42, and 43 that store various information and data including job schedules on the workpieces.

For example, assume that the job schedules for the first, third, fifth, and seventh glass substrates in an individual cassette are to process them (in order) by tester, repairer, cleaner, oven, spacer, and then sealer. And also assume that the job schedules for the remaining glass substrates process them sequentially by cleaner, oven, and then sealer.

In this case, the tester equipment selects the first, third, fifth, and seventh glass substrates from the cassette and tests and repairs them. Then, it cleans, heats and seals all of the glass substrates in the cassette.

The user orders each equipment device to process the specified glass substrates through the user interface 50 that is coupled to the host 10. In this case, job schedules on the input glass substrates are updated in the databases 41, 42, and 43 of the file server 40.

As mentioned, each equipment device selects a specified glass substrate stored in the cassette and performs work according to the different job schedules. This process can be classified into four methods as follows.

In the first method, the equipment devices 30 can select specified glass substrates from the glass substrates stored in the cassette and the specified glass substrates are processed according to the same job schedules. In the second method, the equipment devices 30 can process all the glass substrates stored on the cassette under the same job schedules. The third method allows the equipment devices 30 to select a specified glass substrate stored on the cassette and process it under a different job schedule. Finally, in a fourth method, the equipment devices 30 can select all the glass substrates stored on the cassette and process all of them under different job schedules.

That is, the equipment devices 30 of the embodiment of the present invention can select workpieces and handle them individually or handle them as a batch.

FIG. 2(a) shows a message pattern 100 transmitted to the equipment server 20 by the host according to the first method and the second method.

The message pattern comprises a plurality of records. A first record 110 indicates job instruction contents for each piece of equipment. A second record 120 has global instruction contents for a plurality of glass substrates. To put it more concretely, the second record 120 comprises data fields of the identity of the glass substrates (i.e., LOT ID) 120a, an input port ID 120b of the equipment device 30, the transferred cassette ID 120c, and the job schedule ID 120d. The third record 130 comprises a maximum of twenty fields each having a glass substrate ID and an indication of whether or not to perform a job.

Referring to FIG. 2(a), under the first method, the first record 110 and the second record 120 are configured according to the equipment, and the third field 130 contains job lists and glass substrate IDs of selected glass substrates for a particular piece of equipment. For example, when the first, third, fifth, and seventh glass substrates are to be selected from the cassette, the glass substrate ID and whether or not a job is to be performed are recorded in the corresponding fields of 130a, 130c, 130e, and 130g.

According to the second method, the first record 110 and the second record 120 are configured according to the equipment like the first method. All the fields in the third record 130 record the ID of the glass substrates in the cassette and whether or not to process each glass substrate.

Figure 2B:
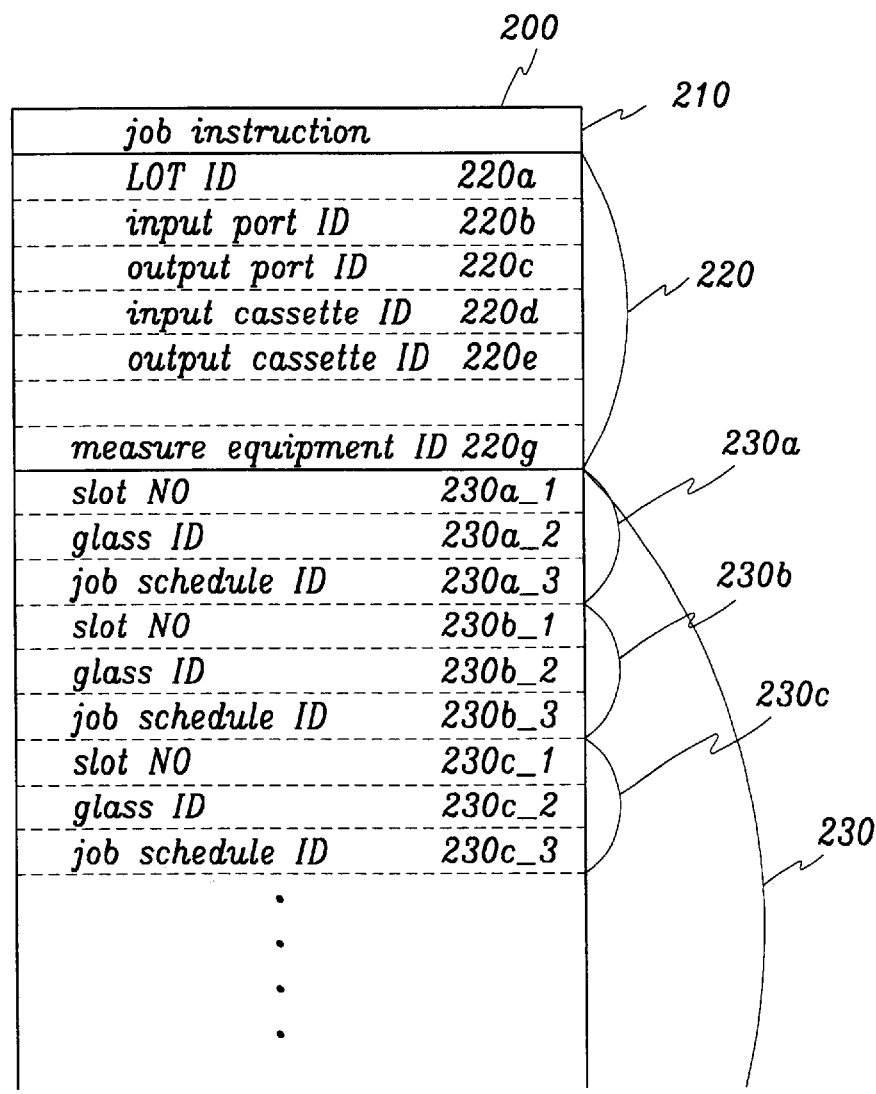
FIGS. 2(a) and (b) are drawings illustrating message patterns used in FIG. 1.

FIG. 2(b) shows a message pattern to be transmitted to the equipment server 20 by the host according to the third and fourth methods.

The message pattern comprises a plurality of records just like in FIG. 2(a). A first record 210 indicates job instruction contents for each piece of equipment. A second record 220 has global instruction contents for a plurality of glass substrates. In other words, the second record 220 comprises data fields of the identity of the glass substrates (i.e., LOT ID) 220a, an input port ID 220b of the equipment devices 30, the output port ID 220c, the transferred cassette ID 220d, the cassette ID 220e to which glass substrate will be inserted is when a job is completed, and the measuring equipment ID 220g. The measuring equipment ID 220g generally refers to a particle measurement and monitoring equipment. The third record 230 comprises maximum twenty fields 230a~230y, each field comprising three sub-fields. That is to say, the first sub-fields 230a_1, 230b_1, 230c_1, ..., 230y_1 indicate slot numbers, and the second subfields 230a_2, 230b_2, 230c_2, ..., 230y_2 indicate glass substrate IDs, and the third subfields 230a_3, 230b_3, 230c_3, ..., 230y_3 indicate job schedule IDs to be executed on the glass substrate indicated by the second sub-fields.

Referring to FIG. 2(b), in the third method, the first record 210 and the second record 220 are configured according to the equipment. Glass substrate IDs and job lists for the glass substrates to be selected from the glass substrates stored on the cassette are written in the third record 230. For example, when the first, third, fifth, and seventh glass substrates on the cassette are to be selected from the glass substrates, the corresponding slot numbers, glass substrate IDs, and job schedule IDs are written on the appropriate fields 230a, 230c, 230e and 230g of the third record 230, and the fields corresponding to remaining glass substrates are kept blank or are assigned default values. When the equipment receives this information, it selects only those slots that have. glass substrate ID and job schedule data recorded in the corresponding sub-fields of the third record 230 and starts the job.

Some equipment may select only the desired slots and sends messages. That is, the third record 230 records information only on the first, third, fifth, and seventh glass substrates, thereby preventing unnecessary blank glass substrates from being transferred.

In the fourth method, the first record 210 and the second record 220 are the same as the third method. Slot numbers, glass IDs and job schedules are recorded in all the fields of the third record 230. In this case, different job schedules are recorded for each glass substrate.

In the above-mentioned four methods, when handling a plurality of glass substrates, the equipment may have options of receiving information either from the host or directly from the equipment.

This explains message patterns used in a system for selectively managing workpieces. From now on, the control method for selectively managing workpieces will now be described.

Figure 3A:
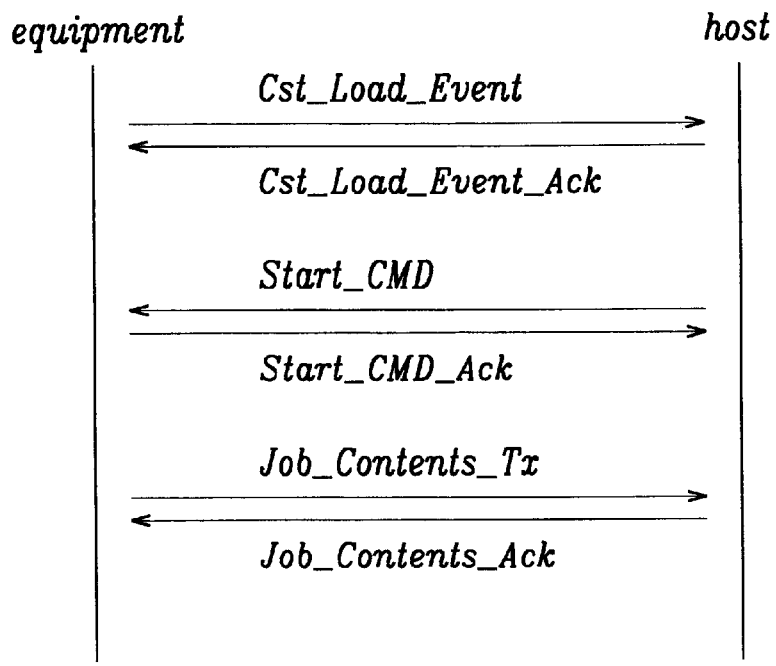
FIGS. 3(a) and (b) are drawings illustrating the flow of messages shown in FIG. 1.
Figure 3B:
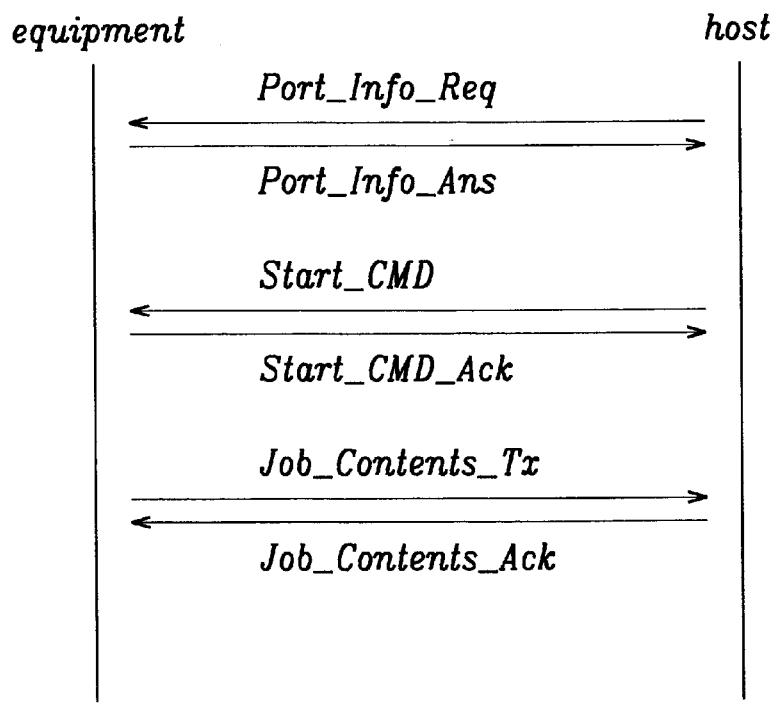
Figure 4:
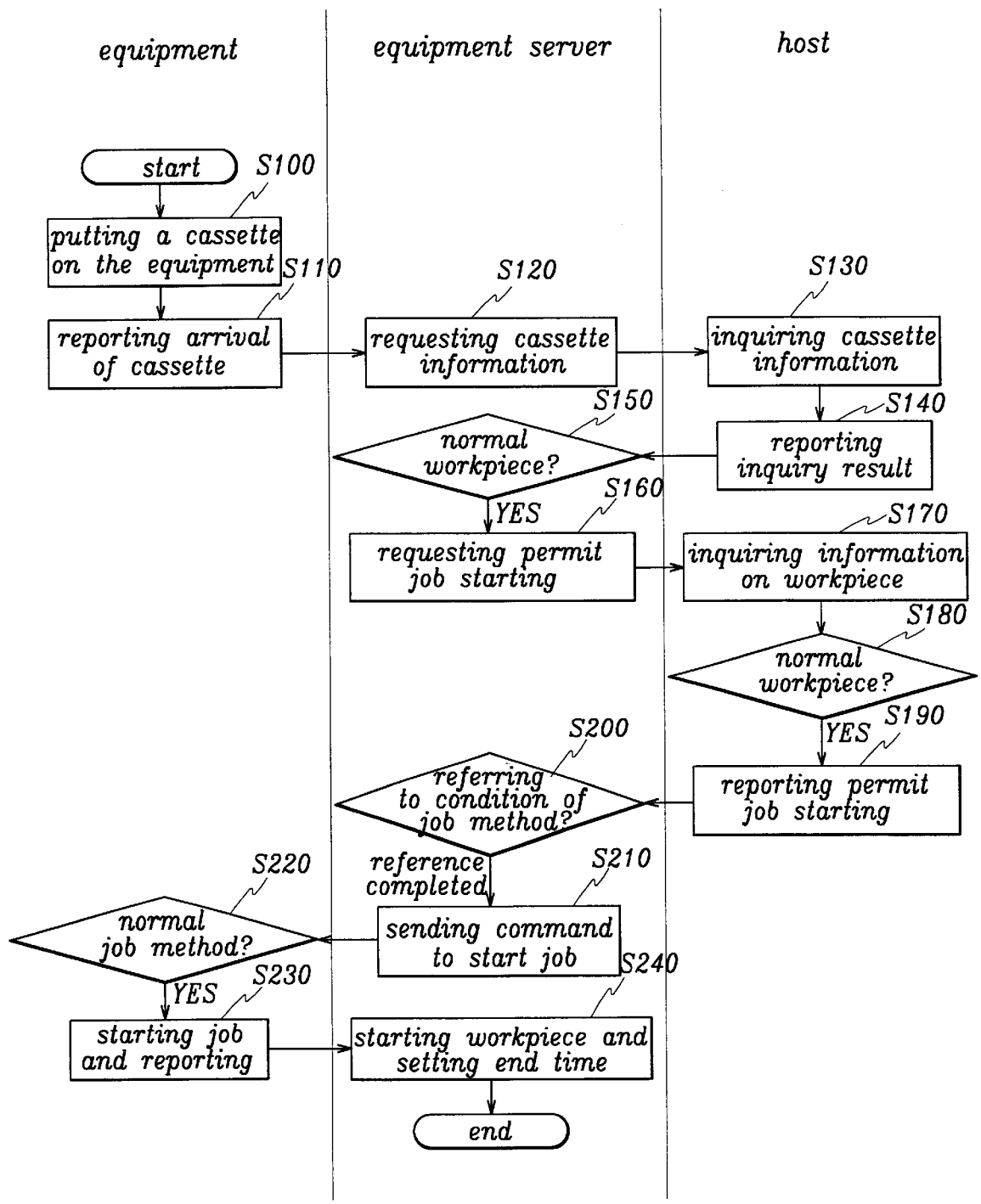
FIG. 4 is a process flow diagram for the system of FIG. 1.

FIGS. 3(a) and 3(b) are diagrams of message exchanges between devices in FIG. 1. FIG. 4 is a process flow diagram of the system in FIG. 1.

In this control method, the host checks the cassette information via communication with a piece of equipment, selects one of the above mentioned four processing methods according to information stored in the file server, and then remotely drives the corresponding cassette.

Referring to FIG. 3(a), the equipment transmits an event Cst_Load_Event to the host indicating that a cassette has been loaded into the equipment by an automatic transferring device. Upon receiving this event message, the host transmits a message Cst_Load_Event_ACK to the equipment and refers to the corresponding cassette job schedule from the database of the file server. The host collects information from this database, and configures the information as a message pattern shown in FIGS. 2(a) or (b), and generates messages to be transferred to the equipment. Depending on the method, the equipment can either select some of the glass substrates from the loaded cassette and assign identical or different job schedules to each glass substrate, or assign identical or different job schedules to all the glass substrates. The host then transmits a job start message of Start_CMD to the equipment. Upon receiving the job start message, the equipment processes a job on either all or selected glass substrates in the cassette according to the received Start_CMD_ACK message. Upon completing the jobs on the glass substrates in the cassette, the equipment reports the job result to the host as a Job_Contents_Tx message. Upon receiving this report, the host transmits an acknowledgment message of Job_Contents_Ack to the equipment.

FIG. 3(b) shows a case when the host requests information on the cassette loaded into each port of equipment before the job is executed.

According to this drawing, when the host issues an information request message of Port_Info_Req to the equipment port, the equipment transmits to the host a reply of Port_Info_Ans that includes information on the corresponding port that has loaded the cassette. Upon receiving this cassette information, the host refers to job schedules in the cassette information in the database of the file server. The subsequent operations of the host and the equipment are the same as those in the description relating to FIG. 3(a).

A control method for selectively managing workpieces will now be described. FIG. 4 shows a process flow chart for the equipment, equipment server and host. FIG. 4 shows a detailed diagram in which the host represented in FIGS. 3(a) and 3(b) is more precisely represented as the equipment server and host.

As shown, when the automatic transferring device (not illustrated) loads a cassette to the port of the equipment (S100), the equipment transfers a corresponding event (S110). The event is transmitted to the equipment server, and the equipment server requests cassette information from the host (S120). The host refers to the corresponding cassette data in the database of the file server according to the cassette information request (S130) and reports back to the equipment server (S140). The equipment server receives the result and determines if the corresponding cassette is a normal workpiece (S150). If the cassette is normal, the equipment server requests a job start permit from the host (S160). The host receives the job start permit request for the corresponding workpiece, and refers again to the workpiece information from the database of the file server (S170). The host again checks if the corresponding workpiece is normal (S180). If the workpiece is normal, the host transmits a job start permit to the equipment server (S190). When the equipment server receives the job start permit, the equipment server reads from the database of the file server the job schedules for the plurality of glass substrates in the corresponding cassette (S200). After reading the job schedules, the equipment server creates a message accordinly, and transmits a job start command to the equipment (S210). When the equipment receives the job start command having the message pattern of FIGS. 2(a) and 2(b), the equipment determines if the job schedule in the corresponding message is normal (S220). If the job schedule is normal, the job starts. After completing the job, the equipment reports it to the equipment server (S230). The equipment server sets the job start and end times of the workpiece (S240).

As described, the equipment receives a job start command as a message pattern from the equipment server. The message comprises a job start command, and a glass substrate selection and a job schedule assignment for the selected glass substrates. The host transmits a glass substrate selection and a job schedule assignment for the selected glass substrates as a first message to the equipment server, and transmits a job start command as a second message to the equipment server.

The present invention allows the selection of a specified workpiece in inline equipment or in a specific device, leaving the remaining workpiece on the cassette, so that the equipment can be remote-controlled automatically without further manual operation or an operator's intervention.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. A system for selectively managing workpieces, comprising:

a database for storing workpiece information and job schedule information on workpieces and a cassette containing the workpieces;

an equipment for receiving the cassette and executing a job on the workpieces in one of the operational modes according to the workpiece information and job schedule information; and a controller referring to the workpiece information and the job schedule information stored in the database and controlling the equipment to execute the job when the cassette is loaded into the equipment, wherein the operational modes comprising:
- (a) a first mode for selecting the workpieces having the same job schedule and executing the job on the selected workpieces under the same job schedule,
- (b) a second mode for selecting all the workpieces and executing the job on all the workpieces under the same job schedule,
- (c) a third mode for selecting one of the workpiece and executing the job on the selected workpiece under the job schedule specifically provided thereto, and
- (d) a fourth mode for selecting all the workpieces and executing the job on all the workpieces under the different job schedules provided respectively thereto.

2. The system of claim 1, wherein the system further comprises a user interface coupled to the controller through which a user may directly select a workpiece to be processed by the equipment.

3. The system of claim 1, wherein the controller comprises:
- an equipment server, coupled to the equipment, for controlling the equipment; and
- a host for transmitting workpiece information and job schedule information to the equipment server when the cassette is loaded into the equipment,
- wherein the workpiece information is to be executed by the equipment, and the job schedule information is for the workpiece selected from the workpieces stored in the cassette.

4. The system of claim 3, wherein the equipment server receives the workpiece information executed by the equipment and a first message from the host containing job schedules for workpieces from a plurality of workpieces stored in a cassette, and transmits a second message containing the job schedules on selected workpiece to the equipment so as to manage the equipment.

5. The system of claim 4, wherein the host comprises:
- a carrier manager for controlling an automatic transferring device so that a cassette is transferred between the equipment and stocker devices;
- a cassette manager for managing job status of the cassette transferred by the automatic transferring device; and
- a workpiece manager for managing the job status and the job schedules for the workpieces stored in a cassette.

6. A control method for selectively managing workpieces, comprising the steps of:
- reporting that a cassette storing the workpieces is loaded into an equipment;
- reading workpiece information to be executed by the equipment from a database and job schedule information on the workpieces selected from the cassette;
- generating and transmitting a job start message containing the workpiece information and job schedule information read from the database;
- receiving the job start message; and
- executing a job on the workpieces in one of operational modes according to the workpiece information and the job schedule information,
- wherein the operational modes comprises:
  - (a) a first mode for selecting ones of the workpieces having the same job schedule and executing the job on the selected workpieces under the same job schedule,
  - (b) a second mode for selecting all the workpieces and executing the job on all the workpieces under the same job schedule,
  - (c) a third mode for selecting one of the workpiece and executing the job on the selected workpiece under the job schedule specifically provided thereto, and
  - (d) a fourth mode for selecting all the workpieces and executing the job on all the workpieces under the different job schedules provided respectively thereto.

* * * * *